United States Patent
Wong (10) Patent No.: US 7,327,597 B1
(45) Date of Patent: Feb. 5, 2008

(54) STATIC RANDOM ACCESS MEMORY ARCHITECTURE

(75) Inventor: Benjamin S. Wong, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 964 days.

(21) Appl. No.: 10/412,566

(22) Filed: Apr. 11, 2003

Related U.S. Application Data (60) Provisional application No. 60/416,013, filed on Oct. 2, 2002.

(51) Int. Cl.
*G11C 11/00* (2006.01)

(52) U.S. Cl. .................................. 365/154; 365/230.03

(58) Field of Classification Search ................. 365/154, 365/156, 205, 207, 230.03, 230.06
See application file for complete search history.

(56) References Cited

U.S. PATENT DOCUMENTS

| | | | | |
|---|---|---|---|---|
| 6,137,730 A | * | 10/2000 | Chien .................... | 365/189.02 |
| 6,366,526 B2 | * | 4/2002 | Naffziger et al. ...... | 365/230.06 |
| 2003/0117878 A1 | * | 6/2003 | Yamada ................ | 365/230.03 |

OTHER PUBLICATIONS

U. S. Pat. Appl. No. 10/177,187, filed Jun. 20, 2002, Leung, Jr. et al.
U.S. Pat. Appl. No. 10/418,634, filed Apr. 17, 2003, Holst et al.

* cited by examiner

*Primary Examiner*—Gene N. Auduong
(74) *Attorney, Agent, or Firm*—Schwegman, Lundberg & Woessner P.A.

(57) ABSTRACT

An architecture for a semiconductor static random access memory (SRAM) is described. In one example, a first set or group or stage of SRAM banks are coupled to a first data bus formed using bit line pairs, and a second set or group or stage of SRAM banks are coupled to a second data bus formed using other bit line pairs. The number of banks coupled to each bit line pair is determined by the SRAM's operating frequency and size. Each data bus is coupled to a sense amplifier. The output from the sense amplifier is then coupled to the bit line pair of a group of SRAM banks. This adjacent group has staging logic coupled to each SRAM bank to store the output of the SRAM bank until the contents from the first group is placed on the bit line of the adjacent stage of SRAM banks. The output from either the first stage or from one of the SRAM banks in the adjacent stage's SRAM banks, which had been stored in the adjacent stage's staging logic, is driven to the sense amplifier coupled to the adjacent stage. Successive stages of SRAM banks can be coupled together until an arbitrary number of stages of SRAM banks have been coupled together.

21 Claims, 7 Drawing Sheets

STATIC RANDOM ACCESS MEMORY ARCHITECTURE

CROSS REFERENCE TO RELATED APPLICATION

This application claims the benefit under 35 U.S.C. 119(e) of U.S. provisional patent application Ser. No. 60/416,013 filed Oct. 2, 2002, entitled "STATIC RANDOM ACCESS MEMORY ARCHITECTURE," the disclosure of which is hereby incorporated by reference in its entirety.

TECHNICAL FIELD

This application relates, in general, to semiconductor memories. More specifically, it relates to static random access memory (SRAM).

BACKGROUND

An SRAM semiconductor memory is typically comprised of a plurality of memory cells, each memory cell having, for example, four to six transistors. Generally, each memory cell is coupled to a column and row select line which is used to select the individual memory cell, and each memory cell receives its input and drives its output onto a pair of sense lines, typically designated sense and sense complement. For purposes of this description, this pair of sense lines (sense and sense complement) shall be called the bit line pair. To read each memory cell, the voltage differential on the bit line pair must be sensed. Reducing the voltage differential on the bit line pair to the minimum level needed to reliably sense the memory cell's content reduces power consumption in the SRAM.

Figure 1:
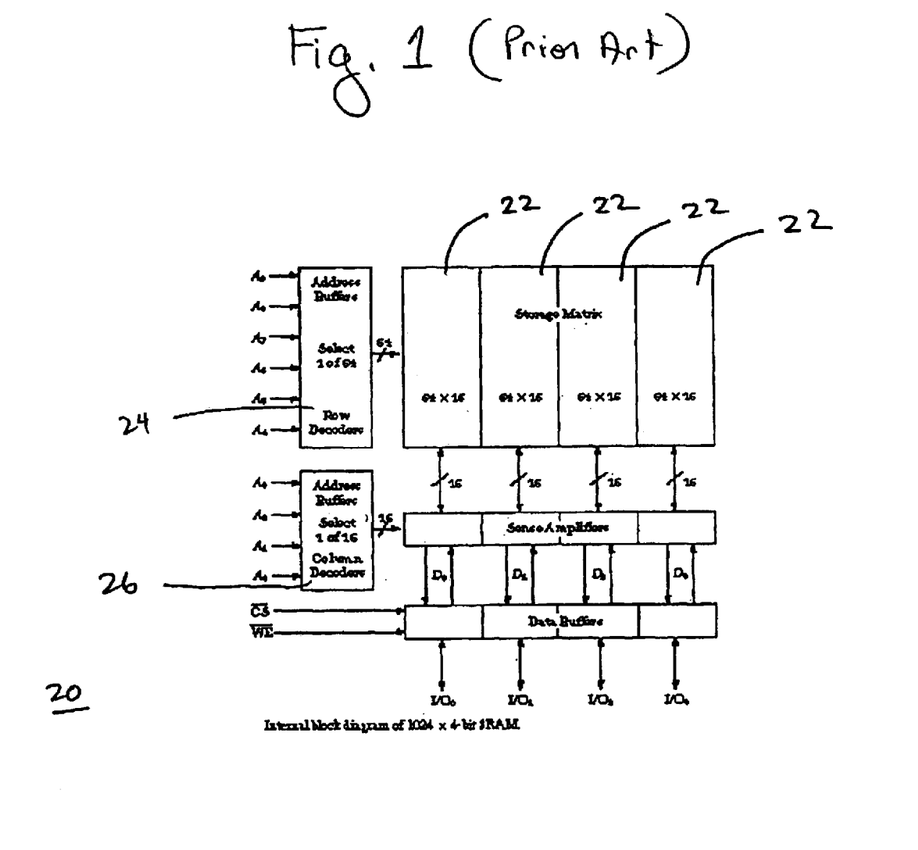
FIG. 1 is a block diagram of a single SRAM bank.

FIG. 1 is a block diagram of the internal structure of a typical 1024 by 4-bit SRAM. The SRAM array 20 consists of four blocks 22 of 64 words by 16 bits each. During a read operation, the high-order 6 bits of the address (A4 through A9) select one of 64 words. Four groups of 16 bits each emerge from the storage array, one group for each of the possible data bits. The four low-order address bits (A0 through A3) select one of 16 bits from each of the four groups to form the 4-bit data word. Writes are similar, except with data flowing in the opposite direction.

This form of two-dimensional decode, with row and column decoders 24, 26, is used universally in memory components. Not only does it keep the memory array square, it also limits the longest lines in the decoders. Although the illustrated SRAM provides a 4-bit data word, the width of the data word is now more typically 16-bit or 32-bit, and 64-bit data word SRAM is also commercially available.

It is known to fabricate large SRAMs from a plurality of smaller, modules that each individually comprise a fully operational SRAM memory, such as the module 20 shown in FIG. 1. These individual SRAM units may be referred to each as a "bank."

Although the memory cells of an SRAM do not need to be continually refreshed, as do those of a dynamic random access memory (DRAM), the number of transistors used for each cell to provide a single memory bit results in a large amount of integrated circuit (IC) area to implement a large SRAM. As SRAM also operates faster than DRAM, SRAM is typically used as a cache memory for the microprocessor, although SRAM cache memories are typically relatively small in size.

In addition to the issues associated with increases in size of SRAMs, microprocessor clock speeds have increased which have increased the clock frequencies of SRAMs. As recognized by the present inventors, the increasing size and speed issues of SRAMs has made the design of conventional SRAM memories problematic. For instance, a certain amount of time is need to drive the bit line pair differential voltage signal, the time being needed to allow for the needed voltage differential to propagate through the length of the bit line pair and reliably indicate the value in the memory cell. Known complementary metal oxide semiconductor (CMOS) fabrication, and operation techniques for SRAM, may pre-charge the bit line pair to reduce the amount of time required to generate and propagate this differential signal. This pre-charging occurs with each clock cycle.

At some combination of SRAM size and frequency of operation, the length of the bit line pair becomes a problem, as recognized by the present inventor. In particular, the propagation delay of the voltage differential through the bit line pair becomes large enough so as to prevent reliable detection of the contents of the addressed memory cell in the available time.

Figure 2:
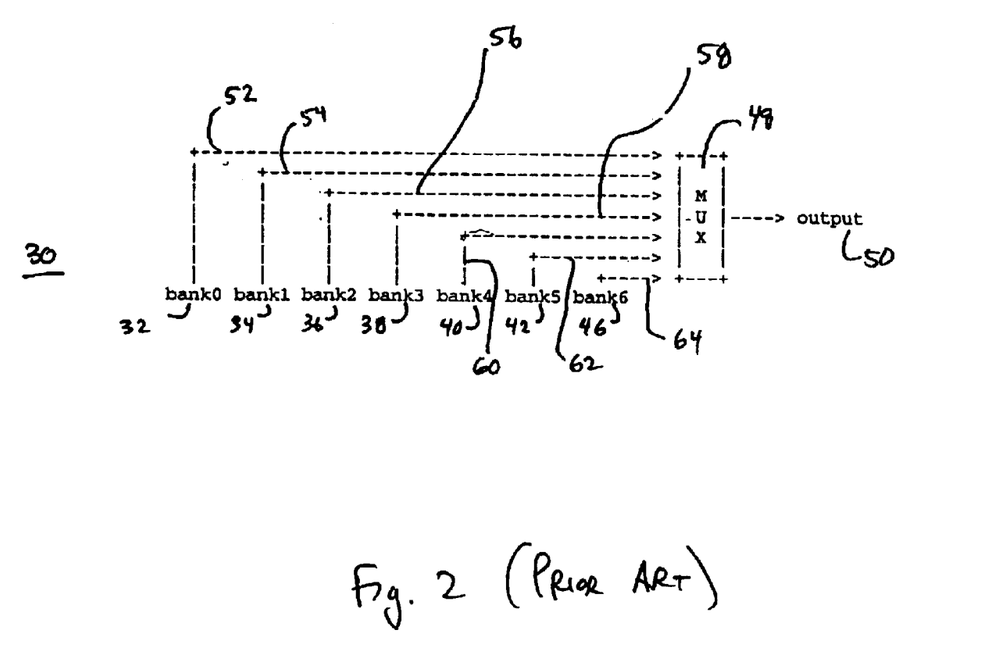
FIG. 2 shows a multi-bank SRAM architecture.

Conventionally, combining many separate SRAM units or "banks" into one large SRAM has been used to provide SRAM memories with greater storage capacity. Referring to FIG. 2 and in a large, multiple bank SRAM design 30, the output from each bank 32–46 is coupled to a MUX 48 having an output 50 which forms the final output of the SRAM 30. In one implementation of the design shown in FIG. 2, full-rail signals with CMOS buffers are driven from the SRAM banks to a static CMOS MUX. A full-rail signal swings across the entire voltage range available to it to generate the requisite logic 0 and logic 1 values. Although a single line (i.e. 52) is shown coupling the banks 32–46 to the MUX 50 in FIG. 2, each of these single lines 52–64 actually comprises N wire tracks, where N is the number of bits in the data word. Thus, if the data word is 16-bits wide, each bank 32–46 would require 16 wire tracks to couple it to the MUX 48. The total number of wire tracks is determined by the number of banks of SRAM memory cells multiplied by the number of data bits. In a large SRAM, comprised of many banks, this arrangement quickly consumes IC real estate available for wire tracks.

Figure 3:
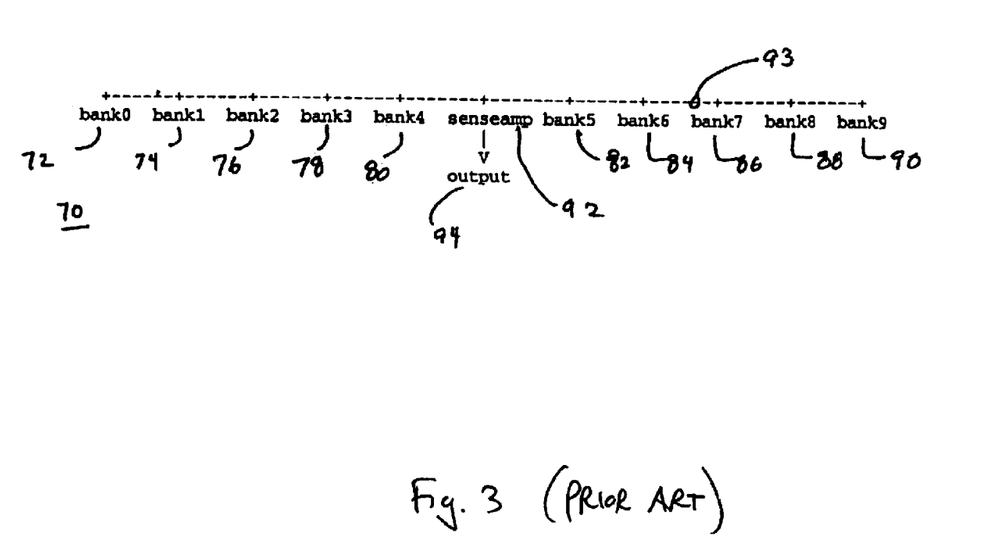
FIG. 3 shows another multi-bank SRAM implementation.

Another known implementation of this MUX function for multiple SRAM banks uses a shared pair of pre-charged, low swing wires that are driven with NMOS true/complement devices/drivers and received by a sense amplifier circuit. FIG. 3 illustrates this second implementation 70, wherein a plurality of banks 72–90 each having a driver (not shown) are coupled with a sense amp 92 over a bit line pair 93. The output 94 of the sense amp 92 provides the output of the memory structure 70.

The number of wire tracks that this approach uses is two times the number of data bits (i.e. for each data bit, there is one pair 93 provided). This approach saves power over the implementation of FIG. 2 and reduces the total number of wire tracks. This implementation is limited, however, by the amount of differential signal that can be driven over the length of wire necessary to couple the banks of memory cells to the sense amplifier. At some point, depending on the physical size and frequency of operation of the SRAM 70 shown in FIG. 3, the bit line pairs running from the SRAM banks will be too long to allow the proper voltage differential to propagate reliably in the time available. To maximize the number of banks that can be coupled to a single sense amplifier, the sense amplifier 92 is placed in the center of the length of the bit line pair 93. In normal operation, one half of the clock cycle is used to drive the signal onto the bit line pair and the other half of the cycle is used to pre-charge the pair. One piece of data is transmitted from the driver to the sense amplifier during each clock cycle.

A drawback of the implementation of FIG. 3 is that once the number of banks has increased beyond a certain point, the length of the bit line pair 93 has increased too much to allow the differential signal to propagate through its length in the time available, preventing the sense amplifier 92 from reading the differential signal reliably. In this example, the exact number of banks and the maximum length of the bit line pair 93 that will work reliably with the banks are related to the clock frequency of the SRAM 70.

As the number of SRAM banks is increased, the length of the bit line pair 93 cannot simply be increased to connect to these additional SRAM banks, for the reasons previously discussed. Extra bit line pair sections will be needed and the output of these additional sections combined in an additional, second sense amplifier. This variation is illustrated in FIG. 4, wherein a first plurality of banks are coupled with a first sense amp, a second plurality of banks are coupled with a second sense amp, and the first and second sense amp drive a third sense amp which provides the output of the memory structure.

Figure 4:
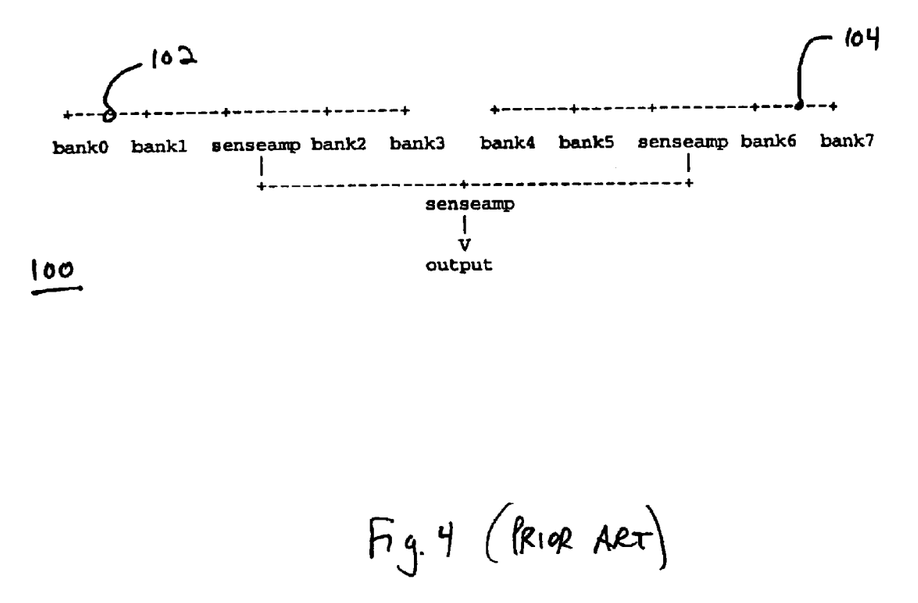
FIG. 4 illustrates a variant of the multi-bank SRAM implementation shown in FIG. 3.

The implementation of FIG. 4 functions essentially as a multi-level MUX, implemented with shared low swing bit line pairs and sense amplifiers as opposed to the CMOS buffers, wires and CMOS MUX of the implementation of FIG. 2. In the variant 100 shown in FIG. 4, as two low swing bit line pairs 102, 104 are used in series, two clock cycles are needed to transport data from the banks to the output. Further, the necessary number of wire tracks doubles at each level of the SRAM hierarchy, which has obvious scaling difficulties.

As recognized by the present inventor, what is needed is an SRAM architecture that can operate reliably at high clock frequencies and that can be expanded in size without allocating excessive IC real estate for wire tracks.

It is against this background that various embodiments of the present invention were developed.

SUMMARY OF THE INVENTION

In light of the above and according to one broad aspect of one embodiment of the present invention, disclosed herein is an architecture for a static random access memory. In a first embodiment of the present invention, sense amplifiers are located at the end of the bit line pairs which couple groups of SRAM banks together. In one example, each bit line pair has the maximum length permitted by the propagation delay of the differential signal and the SRAM's clock frequency. The output from a given sense amplifier is driven onto a bit line pair coupling a neighboring group of SRAM banks together.

In one example, staging logic in the neighboring group of SRAM banks temporarily stores the output from these adjacent SRAM banks. Once the output from the first group of SRAM banks has been driven onto the bit line pair of the adjacent group of SRAM banks, either that output or the output of one of the banks of the adjacent group will be sent to the sense amplifier coupled to the bit line pair coupled to the next group of SRAM banks. In this manner, the output of each preceding group of SRAM banks is cascaded to the next group of SRAM banks until the final group of SRAM banks is reached.

This architecture can be readily expanded to an arbitrary number of groups of SRAM banks. The number of staging logic elements required increases as the number of banks increases, but these staging logic elements generally require less IC area than wire tracks.

According to another broad aspect of an embodiment of the present invention, disclosed herein is a memory for use in a router. In one example, the memory includes a first data bus, a first plurality of banks of SRAM, a first differential sense amplifier, a first output driver, a second data bus, a second plurality of banks of SRAM, a second differential sense amplifier, and a second output driver.

In one embodiment, the first plurality of SRAM banks is coupled with the first data bus, and each bank of said first plurality of SRAM banks has a driver associated therewith for selectively driving a first set of data signals from the first plurality of banks onto the first data bus. The first differential sense amplifier receives the first set of data signals over the first data bus, and the first output driver, being in communications with the first differential sense amp, selectively drives the first set of data signals. The second data bus may be coupled with the first output driver for receiving the first set of data signals, and the second plurality of banks of SRAM is coupled with the second data bus. Each bank of said second plurality of banks has a driver associated therewith for selectively driving a second set of data signals from the second plurality of SRAM banks onto the second data bus. Further, each bank of said second plurality of banks may have one or more logic gates for temporarily storing the second set of data signals. The second differential sense amplifier is coupled with the second data bus, and the second output driver is in communications with the second differential sense amp for selectively driving either the first set of data signals or the second set of data signals.

In another embodiment, the memory may include a third data bus coupled with the second output driver for receiving the first set of data signals or the second set of data signals. A third plurality of banks of SRAM may be coupled with the third data bus, each bank of said third plurality of banks having a driver associated therewith for selectively driving a third set of data signals from the third plurality of banks onto the third data bus, and each bank of said third plurality of banks having one or more logic gates for temporarily storing the third set of data signals. A third differential sense amplifier may be coupled with the third data bus, and a third output driver may be in communications with the third differential sense amp for selectively driving either the first set of data signals, the second set of data signals, or the third set of data signals.

In one example, each data bus includes one or more sets of shared, differential pair bit lines. For instance, each data bus may include thirty-two sets of shared, differential pair bit lines in order to provide a thirty-two bit data word from the memory. Preferably, each SRAM bank provides a data word onto its respective data bus.

In one example, the memory may include a first latch coupled with the first differential sense amplifier for latching a state of the first differential sense amplifier, and a second latch may be coupled with said second differential sense amplifier for latching a state of the second differential sense amplifier. For instance, these latches may be reset-set latches.

In one example, the one or more logic gates for temporarily storing the second set of data signals may include one or more flip flops for storing the second set of data signals at least one clock cycle. The one or more logic gates for temporarily storing the third set of data signals may include one or more flip flops for storing the third set of data signals at least two clock cycles.

In one embodiment, each SRAM bank may include an row address decoder, a column address decoder, and a storage matrix, the row address decoder and said column address decoder for accessing data located in the storage matrix.

The features, utilities and advantages of various embodiments of the invention will be apparent from the following more particular description of embodiments of the invention as illustrated in the accompanying drawings.

DETAILED DESCRIPTION

According to one broad aspect of the invention, disclosed herein is a memory which may be used in a router. In one example, the memory includes a first data bus, a first plurality of banks of SRAM coupled with the first data bus, a first differential sense amplifier receiving the first data bus, and a first output driver receiving the output of the first differential sense amp. The first output driver selectively drives the signal from the first data bus onto a second data bus which has a second plurality of banks of SRAM coupled thereto. A second differential sense amplifier receives the second data bus (as well as the first data bus through the first output driver), and a second output driver selectively drives an output signal which may include data from the first data bus or the second data bus. The memory may be expanded by adding additional data buses coupled with additional SRAM banks. Staging logic or logic gates may be used to temporarily store data from SRAM banks associated with the second and/or subsequent data buses. Various embodiments of the invention will now be discussed.

Figure 5:
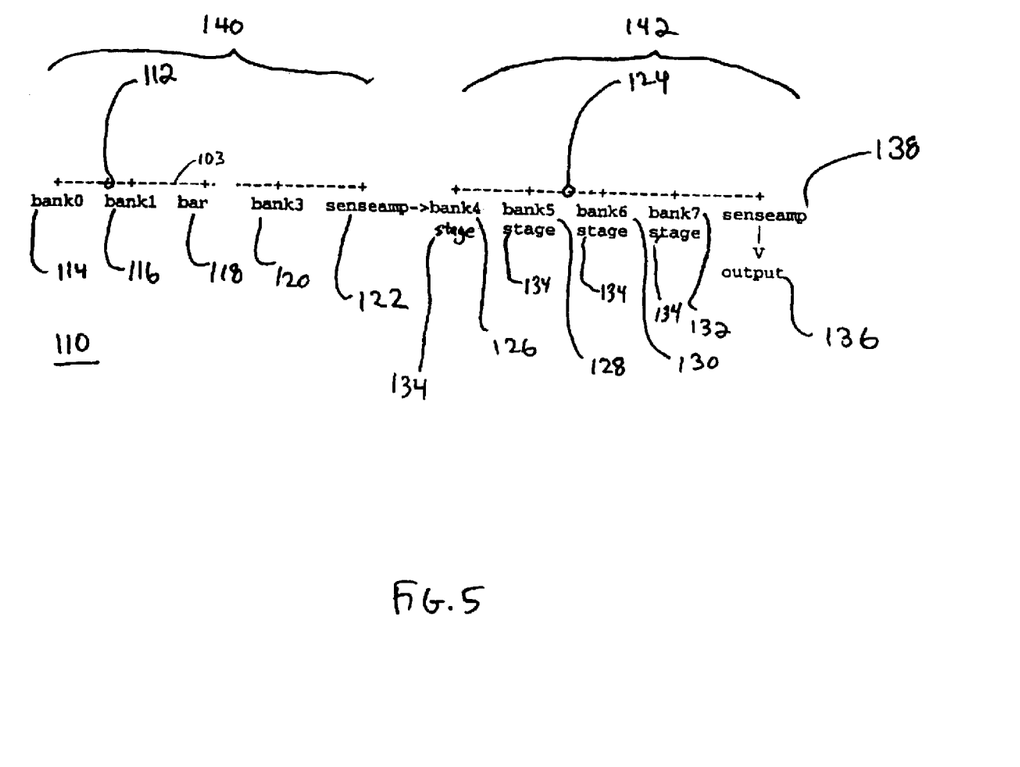
FIG. 5 illustrates a memory architecture in accordance with an embodiment of the present invention.

An embodiment of the present invention is shown in FIG. 5. In one example, a memory 110 includes a bit line pair 112 coupled with one or more SRAM banks 114, 116, 118, 120, herein denoted bank0 through bank3 in this example. In one example, each SRAM bank 114–120 may include an row address decoder, a column address decoder, and a storage matrix, the row address decoder and said column address decoder for accessing data located in the storage matrix. FIG. 1 is one example of an SRAM bank 114–120; however, other types of SRAM banks may also use used.

Preferably, each SRAM bank 114–120 is provided with one or more drivers to drive a differential signal representative of the data stored in the SRAM memory bank 114–120. At the end of this series of SRAM banks, bit line pair 112 is coupled with sense amplifier 122. Although the number of banks used is a matter of choice depending on the particular implementation, in one example, the exact number of banks that are coupled to a single bit line pair is determined by the operating frequency of the SRAM, the size of the SRAM needed, and the voltage differential needed to reliably detect stored information.

The output of sense amplifier 122 is coupled to a second bit line pair 124 that couples an adjacent one or more SRAM banks 126, 128, 130, 132. These SRAM banks (shown as bank4 to bank7 in this example) are, in one example, each provided with a staging logic element or logic gates 134, and may each be provided with one or more drivers (not shown). These staging logic sections 134 store the output of the SRAM bank they are coupled with. The staging logic elements 134 in this embodiment of the present invention acts as temporary storage elements, but additional buffering, processing and amplification could also be performed by the staging logic 134, if necessary.

In FIG. 5, 112 and 124 represent data buses that may be formed from one or more sets of shared, differential bit line pairs. In one example, to provide 32 bits of data per data word, 32 sets of bit line pairs are provided at 112 and 124, and accordingly, sense amps 122 and 138 each receive these 32 sets of bit line pairs (or a plurality of sense amps may be provided as 122/138).

The final output of the bit line pair 124 coupling the second group of SRAM banks (i.e., bank4–bank7) is coupled to an output register 136 through sense amplifier 138.

During operation, one of the SRAM banks 114–120 or 126–132 is selected to provide its data on the bit line pairs 112, 124 (i.e., drive the bit line pair). Depending upon which SRAM bank has been selected to provide the final output, either the output of sense amplifier 122 or the contents of one of the staging logic elements 134 (corresponding to one of bank4, bank5, . . . bank7) will be provided to sense amplifier 138 and then to output 136.

For purposes of this description, it is helpful to think of each group of SRAM banks and associated bit line pair as a stage (i.e., bank0 to bank3 with bit line pair 112 forming a first stage 140; and bank4 to bank7 with bit line pair 124 forming a second stage 142, in this example).

There is a certain amount of delay as data from the preceding groups of SRAM banks transits through each successive group of SRAM banks. For each successive stage (i.e., the second stage 142), an additional level of staging logic elements will be needed compared to the prior stage (i.e. stage 140). For example, if data from the first SRAM stage 140 requires one clock cycle to transit the next SRAM stage 142, the staging logic elements for the second stage 142 will need to store the output of the second stage's 142 SRAM banks 126–132 for one clock cycle. If there were three SRAM stages, the staging logic elements in the third stage would need to store the output of the third stage's SRAM banks for two clock cycles. Logic circuits, typically flip-flops or gates of one type or another, can be used to perform this needed temporary storage.

Figure 6:
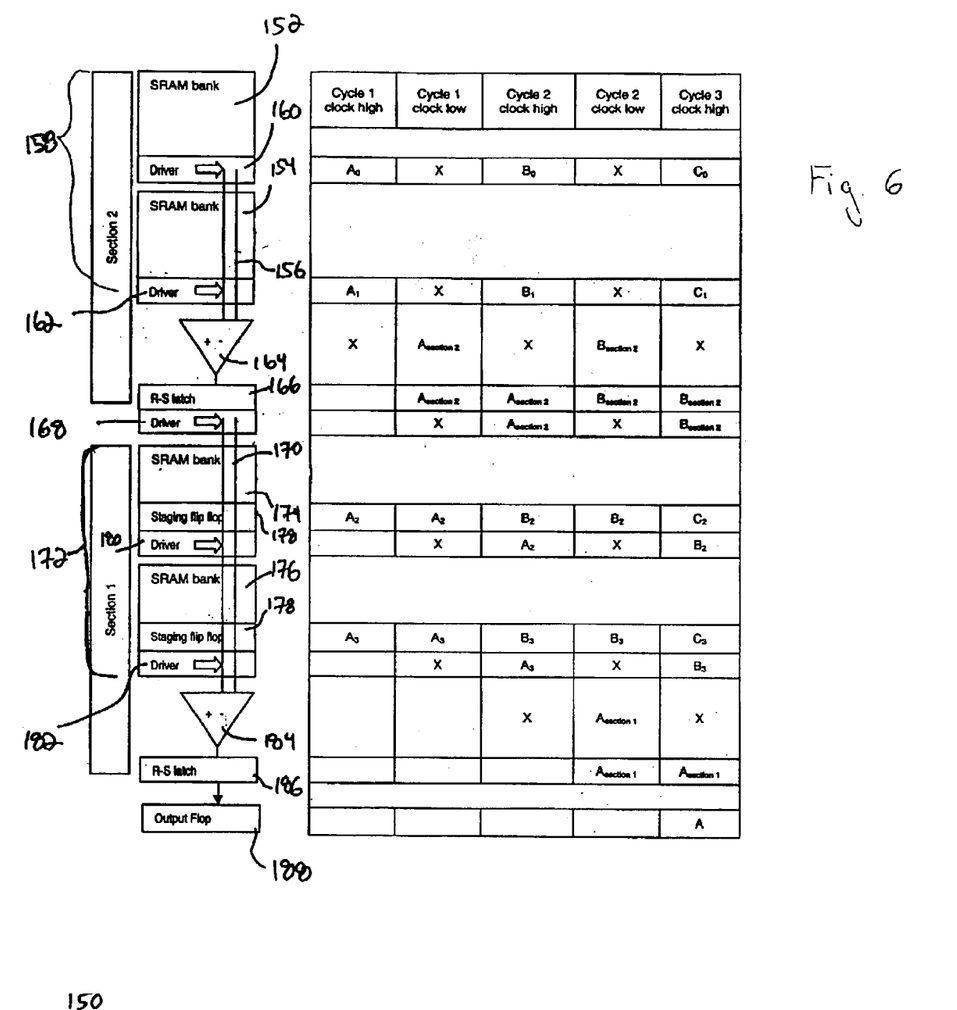
FIG. 6 illustrates another embodiment of the present invention implemented with two groups of two SRAM banks.

FIG. 6 shows another example of a memory 150 of an embodiment of the present invention. Two SRAM banks 152 and 154 are coupled to a bit line pair 156, forming first SRAM stage 158. Drivers 160, 162 selectively drive the data from their respective SRAM banks 152, 154 onto data bus 156.

In turn, bit line pair 156 is coupled to sense amplifier 164, the output of which is provided to a latch 166 (such as a Reset-Set latch) and a driver 168. The output of driver 168 is in turn coupled to bit line pair 170 of an adjacent SRAM stage 172 comprised of SRAM banks 174 and 176. In second stage 172 having SRAM banks 174 and 176, staging logic 178 (comprised of staging flip-flops in one example) stores the output of SRAM banks 174 and 176, respectively.

Drivers 180, 182 selectively drive the data from their respective SRAM banks 174, 176 onto data bus 170.

In operation, after the output from first SRAM stage 158 is captured by latch 166, the contents present at latch 166 (driven by driver 168), or the contents of either SRAM bank 170 or 176 (stored in staging flip-flops 178 until the output of sense amplifier 164 had been placed in latch 166) are sent to sense amplifier 184, which supplies it to R-S latch 186. In turn, latch 186 generates an output 188, which may include a flip-flop.

The addition of further stages of SRAM banks requires staging logic of increasing size, to provide the requisite temporary storage. Although this staging logic does require some IC area, it generally requires less overall than the wire tracks of SRAM designs shown in FIGS. 1–4. Even if the area required were greater, the layout of this logic is relatively simple, compared to routing wire tracks over greater lengths. Also, the capacitance of long wire tracks can begin to sink significant amounts of power, which staging logic does not.

In one example, each driver 160, 162, 168, 180, 182 may be provided with an enable/disable control which may be coupled with the appropriate addressing logic or circuitry so that a particular SRAM bank may be selected for providing data onto the data bus 156, 170 during a particular clock cycle.

Preferably, only one SRAM bank 152, 154, 174, 176 is active to drive its data onto the differential data bus 156, 170. In one example, each driver of each SRAM bank has addressing circuitry coupled thereto for selecting, enabling, or activating the output of a particular SRAM bank to be sent to or driven on to the data bus. Further, the driver of each section (i.e., driver 168 of section 158) may also be coupled with the addressing circuitry so that if a particular SRAM bank coupled with the section (i.e., bank 154 of section 158) associated with the driver, or any SRAM bank associated with a prior section coupled with the data bus of the present section, is selected, then the driver will be activated so as to pass the data present on the data bus down to the following sections.

For instance, in the example of FIG. 6, assume that SRAM bank 154 has been selected for placing data on the data bus 156 during a particular cycle, then the remaining SRAM banks 152, 174, and 176 are all deselected (i.e., the drivers 160, 180, 182 of each of these SRAM banks may be placed in a tri state high impedance mode). Because an SRAM bank associated with driver 168 is active, accordingly, driver 168 is also active/enabled so that driver 168 drives the data on data bus 156 onto data bus 170. In another example, assuming that data from SRAM bank 174 is selected for a particular clock cycle, then drivers 160, 162 associated with SRAM banks 152 and 154 are deselected (along with driver 168) and the driver 182 associated with SRAM bank 176 is also deselected so that the driver 180 for SRAM bank 174 is able to control the state of the data bus 170 during the cycle.

Referring to FIG. 6, in one example, when the clock is low, the data bus 156, 170 may be pre-charged, and on a rising clock edge, the selected drivers which are activated apply data to the data bus. On a falling clock edge, the sense operation occurs. Accordingly, referring to FIG. 6, assume that during clock cycle 1, data A0 is associated with SRAM bank 152, data A1 is associated with SRAM bank 154, data A2 is associated with SRAM bank 174, and data A3 is associated with SRAM bank 176.

In general, during cycle 1, clock high, the data from one of the SRAM banks is driven onto one of the shared data buses, for instance, data A0 from SRAM bank 152, data A1 from SRAM bank 154. Data A2 from SRAM bank 174 and data A3 from SRAM bank 176 are both stored in their respective staging logic 178 during cycle 1, clock high.

During cycle 1, clock low, sense amp 164 senses data from either SRAM bank 152 or 154 (i.e., data A0 or A1) and if there is any data from either SRAM bank 152 or 154, then during cycle 2, clock high, driver 168 drives that data (i.e., data A0 or A1) onto shared data bus 170. This data is sensed by sense amp 184 during cycle 2, clock low, and latched as well by latch 186 and is output during cycle 3, clock high.

Data A2 from SRAM bank 174 and data A3 from SRAM bank 176 are stored in the staging flip flops 178 of each of these SRAM banks for an additional cycle, in one example, so that during cycle 2, clock high, the data at SRAM bank 174 stored in staging flip flop 178 can be driven onto the bus 170. For example, if SRAM bank 174 is selected, then at cycle 2, clock low, the sense amp 184 detects the data A2 and it is latched by latch 186 and output at cycle 3, clock high.

For instance, assume that SRAM bank 154 has been selected to drive the data bus 156 during cycle 1. Accordingly, when the clock is high during cycle 1, the driver associated with SRAM bank 154 applies data A1 to the data bus 156. When the clock goes low during cycle 1, sense amp 164 detects the data A1, and this data is latched by latch 166 and driven on the next rising edge (i.e., during cycle 2 clock high) onto the next data bus 170. During cycle 2, clock low, sense amp 184 senses the data A1 which is latched by latch 186 and driven through output gates or flop 188 during cycle 3, clock high.

Figure 7:
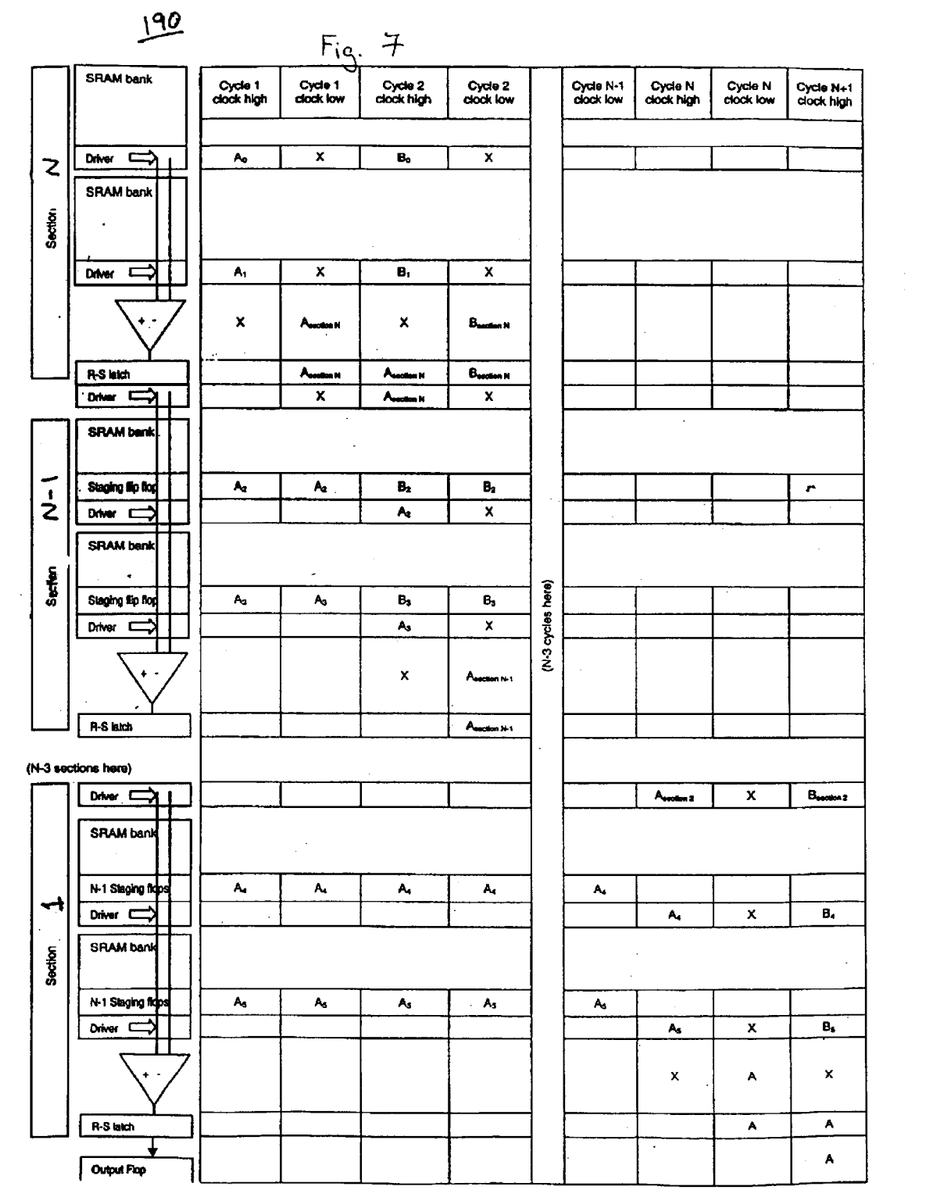
FIG. 7 illustrates another embodiment of the present invention implemented with an arbitrary number of SRAM banks.

FIG. 7 shows another embodiment of the present invention expanded into an SRAM 190 of N groups of SRAM banks. The construction and operation is identical to that of the embodiment shown in FIG. 6 with the addition of additional elements needed to replicate the design to N sections. For N stages, as shown in FIG. 7, N–M staging flip-flops logic are used for the Mth stage's SRAM banks, in one example. For instance, for 3 stages, the first stage may have 2 staging flops/logic to store data for 2 cycles; the second stage may have 1 staging flop/logic to store data for 1 cycle. As shown in FIG. 7, the data may flow through the memory in a similar manner as described above with reference to FIG. 6.

Accordingly, it can be seen that a memory could be formed of a plurality of sections, wherein each section has a plurality of banks coupled with a shared data bus being received by a sense amplifier, and these various sections can be interconnected through drivers so that the data from a particular SRAM bank can be selectively placed on the data buses and provided or made available to circuits external to the memory. In this way, it can be seen that the memory architecture shown in the various embodiments of FIGS. 5–7 can support a large number of SRAM banks and support a large amount of memory.

Further, one or more of the embodiments described herein may be used within a device or apparatus such as a router or computer. One example of a router is described in co-pending application Ser. No. 10/177,496 entitled "Packet Routing and Switching Device" filed Jun. 20, 2002, the disclosure of which is incorporated herein by reference in its entirety.

While the methods disclosed herein have been described and shown with reference to particular operations performed in a particular order, it will be understood that these operations may be combined, sub-divided, or re-ordered to form equivalent methods without departing from the teachings of the present invention. Accordingly, unless specifically indicated herein, the order and grouping of the operations is not a limitation of the present invention.

While the invention has been particularly shown and described with reference to various embodiments thereof, it will be understood by those skilled in the art that various other changes in the form and details may be made without departing from the spirit and scope of the invention.

I claim:

1. A memory for use in a router, comprising:
   a first data bus;
   a first plurality of banks of static random access memory (SRAM), each bank of said first plurality of banks having a driver associated therewith for selectively driving a first set of data signals from the first plurality of banks onto the first data bus;
   a first differential sense amplifier receiving the first set of data signals over the first data bus;
   a first output driver in communications with the first differential sense amp for selectively driving the first set of data signals;
   a second data bus coupled with the first output driver for receiving the first set of data signals;
   a second plurality of banks of SRAM, each bank of said second plurality of banks having a driver associated therewith for selectively driving a second set of data signals from the second plurality of banks onto the second data bus, and each bank of said second plurality of banks having one or more logic gates for temporarily storing the second set of data signals; and
   a second differential sense amplifier coupled with the second data bus; and
   a second output driver in communications with the second differential sense amp for selectively driving either the first set of data signals or the second set of data signals.

2. The memory of claim 1, further comprising:
   a third data bus coupled with the second output driver for receiving the first set of data signals or the second set of data signals;
   a third plurality of banks of SRAM, each bank of said third plurality of banks having a driver associated therewith for selectively driving a third set of data signals from the third plurality of banks onto the third data bus, and each bank of said third plurality of banks having one or more logic gates for temporarily storing the third set of data signals; and
   a third differential sense amplifier coupled with the third data bus; and
   a third output driver in communications with the third differential sense amp for selectively driving either the first set of data signals, the second set of data signals, or the third set of data signals.

3. The memory of claim 1, wherein said first data bus includes one or more sets of shared, differential pair bit lines.

4. The memory of claim 3, wherein said first data bus includes thirty-two sets of shared, differential pair bit lines in order to provide a thirty-two bit data word.

5. The memory of claim 1, wherein each bank of said first plurality of banks of static random access memory (SRAM) provides a data word onto said first data bus.

6. The memory of claim 1, further comprising:
   a first latch coupled with said first differential sense amplifier for latching a state of the first differential sense amplifier.

7. The memory of claim 6, wherein the latch is a reset-set latch.

8. The memory of claim 1, further comprising:
   a second latch coupled with said second differential sense amplifier for latching a state of the second differential sense amplifier.

9. The memory of claim 2, further comprising:
   a third latch coupled with said third second differential sense amplifier for latching a state of the third differential sense amplifier.

10. The memory of claim 1, wherein said one or more logic gates for temporarily storing the second set of data signals includes one or more flip flops for storing the second set of data signals at least one clock cycle.

11. The memory of claim 1, wherein said one or more logic gates for temporarily storing the third set of data signals includes one or more flip flops for storing the third set of data signals at least two clock cycles.

12. The memory of claim 1, wherein said each bank of said first plurality of banks of static random access memory (SRAM) includes an row address decoder, a column address decoder, and a storage matrix, said row address decoder and said column address decoder for accessing data located in the storage matrix.

13. A memory for use in a router, comprising:
    a plurality of SRAM banks, each SRAM bank comprising an SRAM memory of predetermined data word width;
    a first bit line data word bus, a predetermined number of SRAM banks being coupled to the first bit line data word bus;
    a first sense amplifier coupled to the first bit line data word bus and having an output;
    at least a second plurality of SRAM banks;
    at least a second bit line data word bus, the second bit line data word bus being coupled with the output of the first sense amplifier;
    staging logic coupled to each of the second plurality of SRAM banks coupled to the second bit line data word bus, the staging logic storing an output from each of the second plurality of SRAM banks until the output from the first sense amplifier can be placed on the second bit line data word bus;
    at least a second sense amplifier coupled to the second bit line data word bus; and
    an output stage coupled to the second sense amplifier for storing and providing the output of the first and second SRAM banks.

14. The memory of claim 13, wherein said first bit line data word bus includes one or more sets of shared, differential pair bit lines.

15. The memory of claim 13, wherein each SRAM bank of said plurality of banks provides a data word onto said first bit line data word bus.

16. The memory of claim 13, further comprising:
    a first latch coupled with said first sense amplifier for latching a state of the first sense amplifier.

17. The memory of claim 15, wherein the latch is a reset-set latch.

18. The memory of claim 13, further comprising:
    a second latch coupled with said second sense amplifier for latching a state of the second sense amplifier.

19. The memory of claim 13, wherein said staging logic includes one or more flip flops for storing the output from each of the second plurality of SRAM banks at least one clock cycle.

20. The memory of claim 13, wherein the SRAM memory includes an row address decoder, a column address decoder, and a storage matrix, said row address decoder and said column address decoder for accessing data located in the storage matrix.

21. In an SRAM memory comprised of a plurality of banks, a predetermined number of the SRAM banks being coupled to a bit line pair, each bit line pair being coupled to a sense amplifier, an SRAM architecture for use in a router, comprising:

adjacent bit line pairs coupled together successively and in a hierarchy, each successive adjacent bit line pair with attached SRAM banks being coupled to the bit line pair of the adjacent plurality of coupled SRAM banks, each successive plurality of coupled SRAM banks having logic which stores the output of the attached SRAM banks for a period of time necessary for the output of all preceding plurality of coupled SRAM banks to traverse the preceding bit line pairs and to be placed on the bit line pair attached to the next successive plurality of coupled SRAM banks.

* * * * *